(12) United States Patent
Baxter

(10) Patent No.: US 8,134,875 B2
(45) Date of Patent: Mar. 13, 2012

(54) DATA STORAGE SYSTEM WITH REMOVABLE MEMORY MODULE HAVING PARALLEL CHANNELS OF DRAM MEMORY AND FLASH MEMORY

(75) Inventor: Glenn A. Baxter, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 580 days.

(21) Appl. No.: 12/329,993

(22) Filed: Dec. 8, 2008

(65) Prior Publication Data

US 2010/0142243 A1     Jun. 10, 2010

(51) Int. Cl.
*G11C 7/00* (2006.01)
*G06F 12/06* (2006.01)
*G06F 13/00* (2006.01)

(52) U.S. Cl. ........... 365/189.2; 365/185.08; 365/185.11; 365/49.1; 711/5; 711/101; 711/115

(58) Field of Classification Search .................. 365/149, 365/185.08, 185.11, 49.1, 49.12, 189.2; 711/101, 711/103, 105, 108, 115, 5; 326/37
See application file for complete search history.

(56) References Cited

U.S. PATENT DOCUMENTS

| 5,963,746 | A | 10/1999 | Barker et al. |
| 6,460,122 | B1* | 10/2002 | Otterness et al. .............. 711/154 |
| 2003/0018868 | A1 | 1/2003 | Chung |
| 2004/0044876 | A1* | 3/2004 | Settles .............................. 712/1 |
| 2005/0188149 | A1 | 8/2005 | Kaler |
| 2008/0104344 | A1* | 5/2008 | Shimozono et al. .......... 711/162 |
| 2008/0201574 | A1* | 8/2008 | Haneda ......................... 713/153 |

* cited by examiner

*Primary Examiner* — J. H. Hur
(74) *Attorney, Agent, or Firm* — Kenneth Glass; Kevin T. Cuenot

(57) ABSTRACT

A data storage system includes a first circuit board, a plurality of sockets coupled to the first circuit board, a connector coupled to each of the sockets for coupling each of the sockets to external circuitry, and a plurality of memory modules, each memory module disposed within one of the sockets. The memory module includes a circuit board, an integrated circuit device having configurable blocks, DRAM devices that form parallel channels of DRAM memory and flash memory devices that form parallel channels of flash memory. The memory module also includes an interface electrically coupled to the integrated circuit device for coupling input and output between the integrated circuit device and external circuitry.

20 Claims, 11 Drawing Sheets

DATA STORAGE SYSTEM WITH REMOVABLE MEMORY MODULE HAVING PARALLEL CHANNELS OF DRAM MEMORY AND FLASH MEMORY

FIELD OF THE INVENTION

Embodiments of the invention relate to data storage in a computer system. Specifically, embodiments relate to flash DRAM usage in a system.

BACKGROUND OF THE INVENTION

Enterprise class storage requires a highly reliable storage medium with very fast performance. The present solutions that exist today fall loosely into one of two areas: Hard disk drive (HDD) based platforms or solid state disk (SSD) based platforms. Both solutions accomplish the same effect, that of allowing users to access long term storage via some means of communication such as Ethernet. Where they differ however is their expense, performance, power requirements, and area requirements. The HDD based solutions are generally less expensive, have less performance, consumer more power and require more physical space. In contrast, the SSD based storage solutions are generally much more expensive, have much more performance, consume more power and require less physical space.

One major issue for either an SSD or HDD based enterprise class storage device is that the host, typically some form of Intel x86 class of computer must run a disk operating system (DOS) in order to be able to communicate between the application request for data (e.g. a file) and the actual physical contents on HDD(s) or SSD(s). In conventional HDD and SSD systems, the host controls everything that the drive does. Essentially the drive is "dumb" because it only knows how to respond for requests for a sector of data. As such, there is a centralized bottleneck that forces some number of HDDs or SSDs to be attached to a host so the host can convert between the file request and actual sector address of the data on the drives.

Though conventional enterprise class storage solutions are adequate for many applications, their limitations pose serious problems in applications where very large amounts of data must be stored and processed. For example, the PanSTARRS program run by the University of Hawaii will consist of four 2-meter telescope each of which will have a 1.4 gigapixel camera attached and will take a few hundred pictures of the sky every night looking for near earth objects—those which might conceivably hit the earth. To do this, PanSTARRS must process each 3 gigabyte image in a number of mathematical operations, reduce the data, and digitally look for the objects which have moved frame to frame. From this data an ephemeris is calculated which predicts the path of the found objects. The data processing and storage requirements for this are simply staggering. Something like 4.8 terra bytes of raw data are produced and must be processed and reduced.

Similarly, the Large Hadron Collider (LHC) is the worlds largest collider project with an underground ring that is 17 miles around. The LHC produces the worlds most energetic collisions between particles. The detector array senses approximately 300 Gb/sec of data, generating 27 terra bytes of raw data per day, which is placed in a repository, along with the reduced data set.

Both the PanSTAARs and LHC examples represent a new class of computational and storage requirements that are often referred to as terra-scale data sets or exacomputing. Today, these are typically effected by massive arrays of PCs tied together to form a network. This provides a large amount of computational horsepower at a reasonable cost, but with fairly large infrastructure, area, and cooling requirements overhead.

In all of these applications, (Enterprise class storage, terra-scale data sets or exacomputing), reliability is of vital importance. SSDs are based on flash memory technology, typically NAND flash. In order to achieve high reliability using flash memory technology high end wear leveling hardware and good hardware based spare sectoring technology are required. In addition, wear leveling algorithms, error coding and correction (ECC) algorithms and spare sectoring methodology are required to obtain the desired high reliability. These requirements can change over the life of the flash device, as well as over the life of the product which uses the flash device. SSDs are often built using hard coded Application Specific Integrated Circuit (ASIC) technology and thus cannot be changed later without completely replacing the hard coded ASIC's, which is expensive and time consuming.

In addition, as new flash memory device technologies come on the market, conventional systems that use hard coded ASIC's may not be able to utilize the new flash memory since the wear leveling algorithms, ECC algorithms and spare sectoring methodologies may not be compatible. In these instances, to utilize the new flash memory technologies, the hard coded ASIC's must be replaced, involving significant expense and effort.

Accordingly, there is a need for a method and apparatus for data storage using flash memory that can adapt to changing requirements of the flash memory. In addition, there is a need for a method and apparatus for data storage that will allow for easily changing wear leveling algorithms, ECC algorithms and spare sectoring methodology. Also, there is a need for a method and apparatus for data storage that will allow for easily implementing new flash memory technologies. Moreover, there is a need for a method and apparatus for data storage that will overcome the limitations of conventional data storage systems that include massive arrays of PCs tied together to form a network. Furthermore, there is a need for a method and apparatus for data storage that will reduce the large amount of physical volume that present day SSD and HDD solutions require.

SUMMARY OF THE INVENTION

A memory module is disclosed that includes a circuit board, an integrated circuit device having configurable logic, a plurality of Dynamic Random Access Memory (DRAM) devices electrically coupled to the integrated circuit device so as to form a plurality of parallel channels of DRAM memory, and a plurality of flash memory devices coupled to the integrated circuit device so as to form a plurality of parallel channels of flash memory. The memory module also includes an interface electrically coupled to the integrated circuit device for coupling input and output between the integrated circuit device and external circuitry. The integrated circuit device, the DRAM devices and the flash memory devices are coupled to the circuit board.

In one aspect of the present invention a data storage system is disclosed that includes a first circuit board, a plurality of sockets coupled to the first circuit board, a connector coupled to each of the sockets for coupling each of the sockets to external circuitry, and a plurality of memory modules, each memory module disposed within one of the sockets. In one embodiment each memory module includes an interface that is a card-edge connector that is configured to be coupled to a socket such that the memory module can be inserted into the socket for adding memory to the data storage system and such that the memory module can be removed from the socket for removing memory from the data storage system.

The apparatus and methods of the present invention provide data storage suitable for enterprise class storage, terrascale data sets or exacomputing applications. Because the apparatus and methods of the present invention utilize integrated circuit devices having programmable logic, they can be easily updated to accommodate new wear leveling algorithms, error coding and correction (ECC) algorithms and spare sectoring methodology to maintain high reliability over their life span. In addition, as new flash memory device technologies come on the market, the memory modules can be replaced by memory modules that include the new flash memory device by simply removing the old memory modules and inserting the new memory modules. Moreover, each memory module includes an integrated circuit device that can be used to search and perform operations on the data, overcoming the limitations of conventional data storage systems that include massive arrays of PCs having conventional HDD or SSD data storage devices. Furthermore, the apparatus and methods of the present invention provide high density data storage, requiring less physical volume than conventional SSD and HDD systems.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1A:
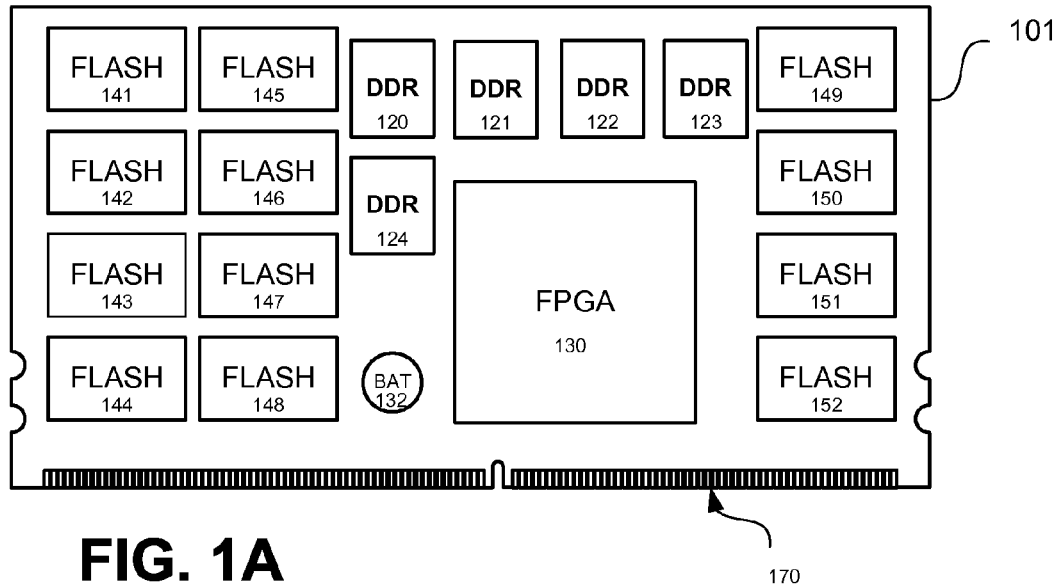
FIG. 1A shows a front side of a memory module in accordance with an embodiment of the present invention.
Figure 1B:
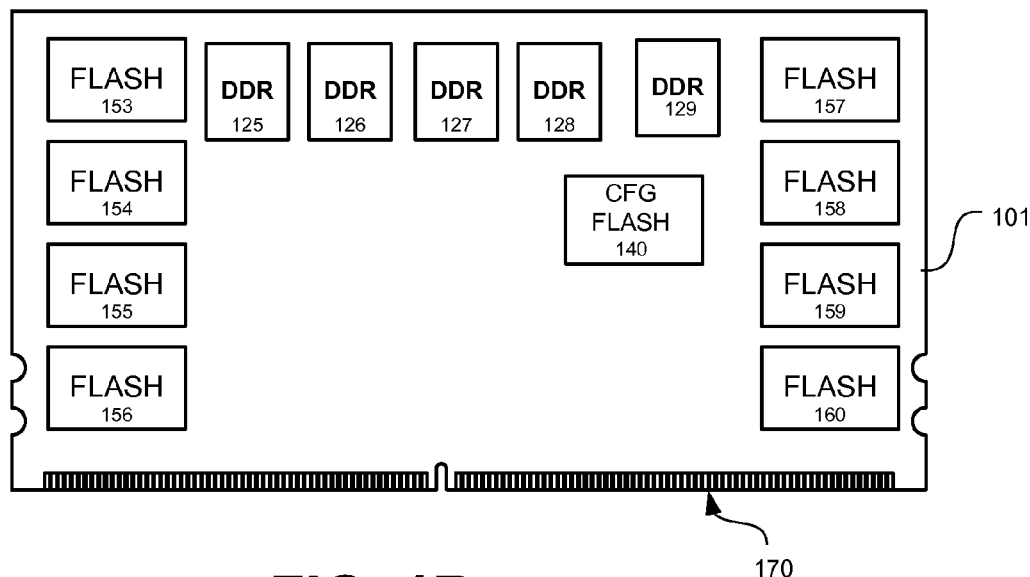
FIG. 1B shows a back side of the memory module of FIG. 1A in accordance with an embodiment of the present invention.

FIGS. 1A-1B show a memory module 100 that includes a circuit board 101 and an integrated circuit device 130 having configurable logic. In the present embodiment integrated circuit device 130 is a field programmable gate array device that is attached to circuit board 101. However, alternatively, integrated circuit device 130 can also be a programmable logic device (PLD) or other type of device having configurable logic.

Memory module 100 includes Dynamic Random Access Memory (DRAM) devices 120-129, flash memory devices 140-160, optional battery 132 and interface 170. Interface 170 is electrically coupled to integrated circuit device 130 for coupling input and output between integrated circuit device 130 and external circuitry. In the present embodiment interface 170 is a card-edge connector that is configured to be coupled to a socket of a memory storage device such that the memory module can be inserted into the socket for adding memory to the memory storage device and such that the memory module can be removed from the socket for removing memory from the memory storage device.

In one embodiment integrated circuit device 130, flash memory devices 140-160 and DRAM devices 120-129 and battery 132 are soldered to circuit board 101, with traces formed on circuit board 101 electrically connecting integrated circuit device 130 to DRAM devices 120-129, flash memory devices 140-160, battery 132 and the card-edge connector of interface 170.

Continuing with FIGS. 1A-1B, DRAM devices 120-129 are coupled to integrated circuit device 130 so as to form a plurality of parallel channels of DRAM memory and flash memory devices 140-160 are coupled to integrated circuit device 130 so as to form a plurality of parallel channels of flash memory.

Flash memory device 140, that can also be referred to herein as a "configuration flash memory device" stores configuration data for configuring integrated circuit device 130. In the present embodiment flash memory device 140 is a single packaged 64 gigabyte flash memory die that is soldered to circuit board 101. However, alternatively, a flash memory device 140 can be used that stores more or less flash memory, or that includes multiple flash die that are configured as a single channel of flash memory.

Figure 2:
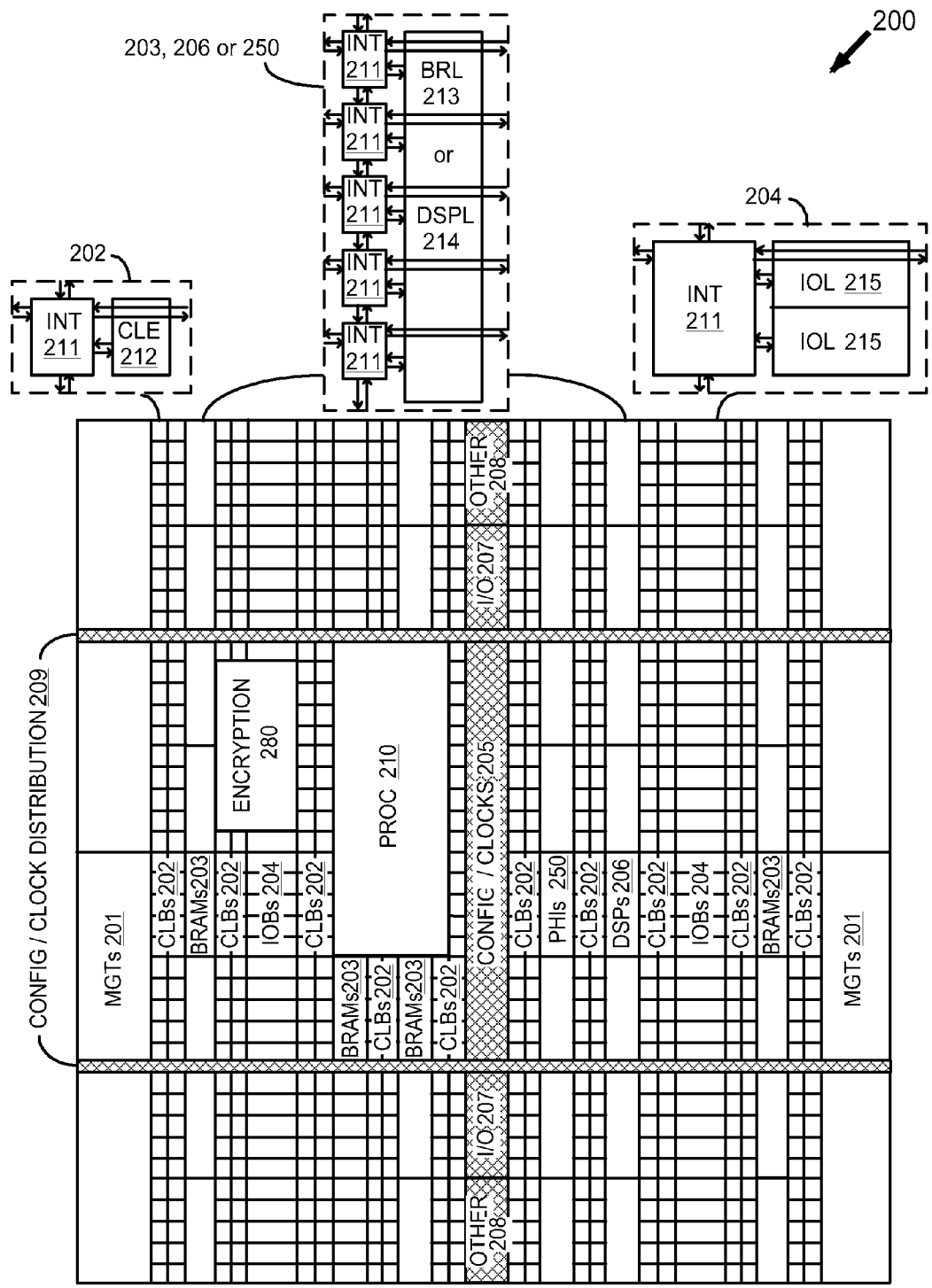
FIG. 2 shows a field programmable gate array architecture in accordance with an embodiment of the present invention.

In the embodiment that is shown in FIG. 2 integrated circuit device 130 is a Field Programmable Gate Area (FPGA) die having a FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), interface tiles (PHIs) 250 and other programmable logic 208 such as digital clock managers, analog-to-digital converters, system monitoring logic, and so forth. In addition, integrated circuit device 130 may include one or more dedicated processor blocks (PROC 210) and/or an encryption logic block (ENCR 280).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as five CLBs, but other numbers (e.g., six) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. For example, the numbers of logic blocks in a column, the relative width of the columns, the number and order of columns, the types of logic blocks included in the columns, the relative sizes of the logic blocks, the incorporation of hard blocks such as PROC 210, and the interconnect/logic implementations included at the top of FIG. 2 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 3:
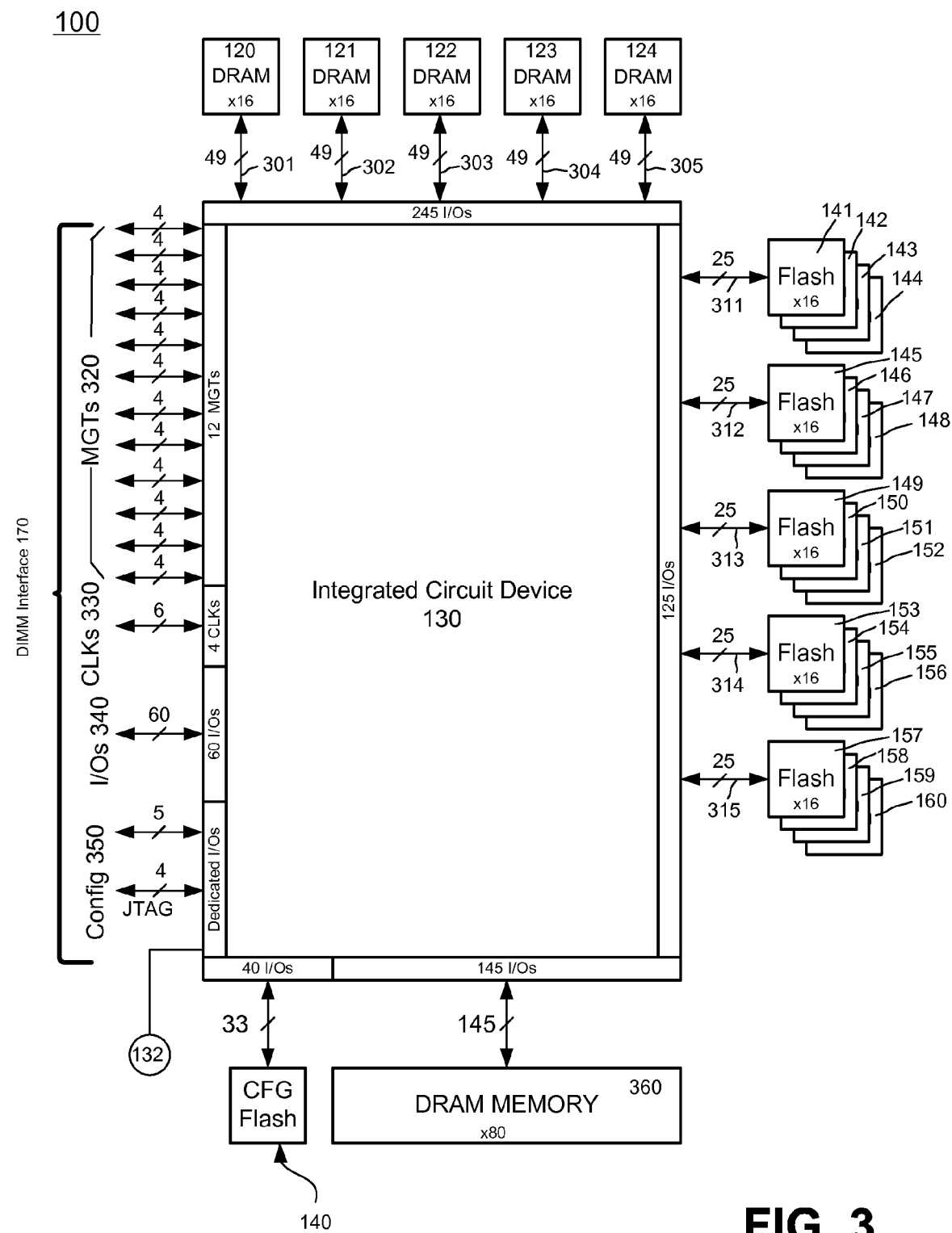
FIG. 3 is a block diagram of a memory module that illustrates the connections between the integrated circuit device and the other components of the memory module in accordance with an embodiment of the present invention.

FIG. 3 shows an embodiment of memory module 100 in which integrated circuit device 130 is a field programmable gate array device having some or all of the features shown in FIG. 2. The use of an integrated circuit device 130 that is a field programmable gate array device provides logic, control, and interface capabilities that prior art memory modules lack. More particularly, in the present embodiment integrated circuit device 130 includes hard logic such as multi-gigabit transceivers (MGTs) 201 and central processing units (Processor) 210 and encryption logic (Encryption) 280. In one embodiment integrated circuit device 130 is a XC5VFXT130FFG1136 Virtex-5 FXT field programmable gate array device manufactured by Xilinx, Inc. of San Jose, Calif. that contains the following built-in hard cores: PowerPC 440 CPUs, multi-gigabit transceivers, block random access memory, digital signal processors, CRC error checkers, tri mode Ethernet media access controllers, and PCI.

Input and output interfaces (245 I/Os) couple (e.g., via traces on circuit board 101) directly to DRAM devices 120-124 so as to form five parallel channels of DRAM memory. More particularly, a first channel 301 of DRAM memory is formed by coupling DRAM device 120 directly to integrated circuit device 130, a second channel 302 of DRAM memory is formed by coupling DRAM device 121 directly to integrated circuit device 130, a third channel 303 of DRAM memory is formed by coupling DRAM device 122 directly to integrated circuit device 130, a fourth channel 304 of DRAM memory is formed by coupling DRAM device 123 directly to integrated circuit device 130 and a fifth channel 305 of DRAM memory is formed by coupling DRAM device 124 directly to integrated circuit device 130. Because DRAM devices 120-124 are totally separated in their interfaces to integrated circuit device 130, each of DRAM devices 120-124 can be run independently of the others.

Input and output interfaces (125 I/O's) couple directly to flash memory devices 141-160 so as to form five channels of flash memory. More particularly, in the present embodiment, each flash memory device 141-160 is a single packaged 64 gigabyte NAND based flash memory die that is soldered to circuit board 101. Alternatively, flash memory devices 141-160 can include more than one integrated circuit die, either implemented as separately packaged die or as a multi-chip module that includes more than one physical die. Flash memory devices 141-144 are wired directly to integrated circuit device 130 to form a first channel 311 of flash memory. This is accomplished by wiring the four flash memory devices 141-144 (e.g., via traces on circuit board 101) directly to integrated circuit device 130 such that flash memory devices 141-144 share the same signals other than a means to select each flash memory device 141-144 separately. Flash memory devices 145-160 are wired in the same manner. More particularly, flash memory devices 145-148 are wired directly to integrated circuit device 130 to form a second channel 312 of flash memory, with flash memory devices 145-148 sharing the same signals other than a means to select each flash memory device 145-148 separately. Flash memory devices 149-152 are wired directly to integrated circuit device 130 to form a third channel 313 of flash memory, with flash memory devices 149-152 sharing the same signals other than a means to select each flash memory device 149-152 separately. Flash memory devices 153-156 are wired directly to integrated circuit device 130 so as to form a fourth channel 314 of flash memory, with flash memory devices 153-156 sharing the same signals other than a means to select each flash memory device 153-156 separately. Flash memory devices 157-160 are wired directly to integrated circuit device 130 so as to form a fifth channel 315 of flash memory, with flash memory devices 157-160 sharing the same signals other than a means to select each flash memory devices 157-160 separately.

Input and output interfaces (145 I/O's) couple (e.g., via traces on circuit board 101) directly to DRAM devices 125-129 so as to form a DRAM memory device 360 that is configured as a single channel of X80 DRAM memory. More particularly, each of DRAM devices 125-129 on the back side of circuit board 101 in FIG. 1B are wired to integrated circuit device 130 so as to present an 80-bit interface to integrated circuit device 130, forming a sixth channel of DRAM memory.

Input and output interfaces (40 I/O's) couple (e.g., via traces on circuit board 101) directly to a configuration flash memory device 140. In the present embodiment, configuration flash memory device 140 is a single packaged integrated circuit die, that is a NOR based flash device that is large enough that it is capable of supporting multiple copies of the bit stream and associated software programming code for configuring integrated circuit device 130. Alternatively, configuration flash memory device 140 can include more than one integrated circuit die, either implemented as separately packaged die or as a multi-chip module that includes more than one physical die. In operation, integrated circuit device 130 manages the configuration process and chooses which bit stream and software programming code to load into integrated circuit device 130 based upon pins on DIMM interface 170 and/or configuration modes set within integrated circuit device 130 during normal operation. This multiboot capability provides the ability for a known good configuration of integrated circuit device 130 to take place and then for a new configuration to be loaded into integrated circuit device 130. If the new configuration is determined to be defective, integrated circuit device 130 will reload the original known good configuration. This ability to fail-safe to a known good configuration permits high reliability systems to be built using memory module 100.

Configuration flash memory device 140 can be programmed at the factory before it is soldered down or can be programmed after it is placed on memory module 100, either before it is shipped to a customer or after it has been shipped to the customer. This latter ability allows for in system programming. More particularly, in system programming allows for configuration bit streams and software programming code to be updated after the memory module 100 has been deployed in a system. For example, the original equipment manufacturer (OEM) may wish to charge additional revenue to enable a particular feature on memory module 100. This can be done by the end customer purchasing the configuration bit stream and using an OEM provided tool to program the new feature into configuration flash memory device 140.

In the embodiment shown in FIG. 3, interface 170 includes configuration pins 350, input and output pins 340, clock pins 330 and multi-gigabit transceiver pins 320 that couple directly to corresponding input and output interface on integrated circuit device 130. Input and output interfaces (Dedicated I/O's), including four Joint Test Action Group (JTAG) interfaces and five configuration interfaces connect to configuration pins 350. The dedicated I/O's that couple to configuration pins 350 and to optional battery 132 allow for device configuration, debugging, monitoring, and protection of the contents of integrated circuit device 130.

Configuration pins 350 can be used to update configuration data in integrated circuit device 130 and configuration data flash memory device 140. In one alternate embodiment that is not shown, memory module 100 does not include configuration flash memory device 140. In this embodiment configuration is performed by coupling the configuration data to integrated circuit device 130 through configuration pins 350.

A set of input and output interfaces (60 I/O's) couple to input and output pins 340. User input and/or output pins 340 allow for input and output to be coupled directly to integrated circuit device 130 and directly from integrated circuit device 130 via interface 170.

A set of clock interfaces (4 CLKs) couple to clock pins 330. Clock pins 330 allow for clock signals to be provided to integrated circuit device 130. In addition, in some embodiments of the present invention one or more clock signals are generated by integrated circuit device 130 that are coupled to external circuitry through one or more of clock pins 330.

In the present embodiment integrated circuit device 130 includes encryption logic 280 that is a specialized piece of hard logic that permits configuration bit streams to be encrypted. A key is required to be loaded into integrated circuit device 130 in order to support an encrypted bit stream. This key is lost if a suitable battery back up is not provided, rendering the encrypted bit stream useless.

In an embodiment that includes encryption logic 280 the configuration data and any program data stored in configuration flash memory device 140 is encrypted. To support an encrypted bit stream, two methods are supported. The first method is illustrated in FIGS. 1B and 3 and utilizes battery 132 which is coupled to a dedicated I/O as illustrated in FIG. 3. In this embodiment integrated circuit device 130 is programmed with its key (e.g., by loading the key into encryption logic 280). When memory module 100 is removed from its DIMM socket 402 the key will be retained. Thereby, memory module 100 can be moved from socket to socket and remain operational.

In an embodiment in which a battery 132 is not used, one or more dedicated I/O's couple to encryption battery pins of interface 170 instead of to battery 132. In this embodiment, when memory module 100 is removed from its DIMM socket the key will be deleted from integrated circuit device 130, and thus be made secure. More particularly, the memory module 100 will be rendered unusable until a correct key is loaded. Both methods are allowed for differing security applications.

A set of multi-gigabit transceivers (12 MGTs) couple to Multi-Gigabit Transceiver (MGT) pins 320. These multi-gigabit transceivers can be MGT's 201 shown in FIG. 2. The 12 multi-gigabit transceivers can be used to implement any of a number of possible protocols, including 3 channels of ten gigabit Ethernet, 12 channels of one gigabit Ethernet, 12 channels of Serial Attached SCSI, or 12 channels of Serial ATA. Moreover, in a configuration where multiple memory modules are used, either the multi-gigabit transceivers (e.g., through MGT pins 320) and/or the user input/output pins 340 can be used to cross communicate between modules.

Continuing with FIG. 3, memory module 100 provide for multiple parallel channels of DRAM memory and multiple parallel channels of flash memory. Through the application of multiple parallel streams, memory module 100 has substantially higher memory performance than any prior art DDR2 DIMM is capable of.

In the present embodiment DRAM devices 120-129 are bit width sized to match the bit width of flash memory device data paths so as to reduce wasted cycles of latency in flash memory devices 141-160. More particularly, each of DRAM devices 120-124 are 16-bit Double Data Rate (DDR) Synchronous Dynamic Random Access Memory (SDRAM) integrated circuit devices and each of flash memory devices 141-144 are 16-bit flash memory device, allowing for data to be easily moved between DRAM devices 120-124 and flash memory devices 141-160 across data channels 301-305 and 311-315 while minimizing the number of wasted cycles of latency in the transfer process. Also, the 80-bit interface of DRAM memory 360 corresponds to the interface width of all of DRAM devices 120-124 taken together (5×16) and corresponds to the interface width of all of flash memory devices 141-160 taken together (5×16), allowing for data to be easily moved between flash memory devices 141-160, DRAM devices 120-124 and DRAM memory 360 while minimizing the number of wasted cycles of latency in the transfer process.

Integrated circuit device 130 has a number of different input output standards which can be applied. One skilled in the art will understand that the input output pins of integrated circuit device 130 can be used in a wide variety of ways including as differential and single ended signals, as well as unidirectional or bi-directional signals depending upon the system's requirements. Accordingly, memory modules 100 allow for a significant capability to add signaling to memory module 100 that is simply not present in current memory DIMMs. Thereby, memory module 100 offers substantial advantage over prior art mechanisms because it has high speed serial communications (e.g. MGTs 220) and high speed parallel communications (e.g. I/Os 340).

FIG. 4 shows a data storage system 400 that includes a first circuit board 401, connector 403, power supply 404, switches 440 and sockets 402 that are all attached to circuit board 401. In addition, data storage system 400 includes a plurality of memory modules 100, with each memory module 100 disposed within one of sockets 402.

Power supply 404 is mounted to circuit board 401 and is electrically connected (e.g., via traces on circuit board 401) to switches 440 and to sockets 402 to power switches 440 and modules 100. By having a single power supply instead of 96 separate power supplies (e.g. one per memory module), significant power efficiencies are achieved and the overall product cost is reduced. Moreover, by using a single power supply, failure rates are decreased. In one embodiment, power supply 404 is constructed of two or three separate supplies to provide power supply failover capability.

Connector 403 is electrically connected to each of sockets 402 through switches 440 for coupling each of sockets 402 to external circuitry. Connector 403 includes one or more connector receptacle for coupling data storage system 400 with external circuitry. Though connector 403 is shown as a single connector, alternatively, more than one connector 403 could be used. In the present embodiment connector 403 includes a plurality of ten gigabit Ethernet RJ-45 connector receptacles. However, alternatively connector 403 can include Serial Advanced Technology Attachment (SATA) connectors, or any other type of connection that will allow for coupling data to and from data storage system 400.

Switches 440 are coupled between individual sockets 402 and connector 403. Switches 440 allow for communication not only between each memory module 100 and external circuitry (coupled through connector 403), but also communication between individual memory modules 100. In the present embodiment switches 440 are gigabit Ethernet switches. However; alternatively, other types of switches could also be used.

In the present embodiment an industry standard memory module interface mechanical standard is used, with both memory module 100 and socket 402 conforming to the particular standard. Thereby, costs are reduced as industry standard circuit boards, card-edge connectors and sockets are used.

In the present embodiment interface 170 is a dual in-line memory module (DIMM) interface that includes a card-edge connector for coupling with external circuitry and circuit board 101 and interface 170 conform to the JEDEC DDR2 DIMM interface mechanical standard, though not the electrical requirements. In this embodiment circuit board 101 is a 133.35 mm by 69.84 mm printed circuit board and integrated circuit device 130, flash memory devices 140-160 and DRAM devices 120-129 and battery 132 are soldered to circuit board 101, with traces formed on printed circuit board 101 for electrically connecting integrated circuit device 130, DRAM devices 120-129, flash memory devices 141-160, battery 132 and the 240-pin card-edge connector of interface 170 together. Though memory module 100 in this embodiment conforms to the JEDEC DDR2 DIMM interface mechanical standard, it does not conform to the JEDEC DDR2 DIMM pin out or electrical requirements. In the present embodiment each socket 402 is a DIMM socket that conforms to the JEDEC DDR2 socket interface mechanical standard (e.g., the 240 pin DDRII SDRAM, 1.00 mm Contact Centers Socket outline SO-001B published in July, 2003). However, the socket 402 does not conform to the JEDEC DDR2 DIMM socket pin-out or electrical requirements. More particularly, module 100 and socket 402 have a custom pinout.

In alternate embodiments, memory module 100, interface 170 and socket 402 conform to other mechanical standards that allow for coupling card-edge connectors to a socket such that the circuit board can be easily removed. In one alternate embodiment memory module 100 conforms to the mechanical standards of the JEDEC DDR3 DIMM and socket 402 conforms to the 240 position DDR3 DIMM socket outline with 1.0 mm Contact Centers SO-007B published in September of 2008). In other embodiments, memory module 100 and socket 402 can conform to the JEDEC Mini-DIMM DDR2/DDR3 mechanical standard (e.g., socket 402 can conform to the 244 pin DDRII SDRAM, 0.60 mm Lead Centers Socket outline SO-002B published in February, 2008), or the JEDEC FBDIMM DDR2/DDR3 mechanical standard (e.g., socket 402 can conform to the 240 position socket outline with 1.0 mm Lead Centers SO-003B published August 2006) or the JEDEC SO-DDR2 SDRAM mechanical standard, or the JEDEC SO-DDR3 SDRAM mechanical standard (e.g., socket 402 can conform to the 204 pin SO-DDR3 SDRAM socket outline with 0.6 mm Contact Centers SO-006B published in October of 2007).

In the present embodiment data storage system 400 is configured to fit within enclosure 410 which is an industry standard 2 U rack enclosure. In one embodiment enclosure 410 has a length of 26 inches, a width of 16.75 inches and a height of 3.25 inches. Though data storage system 400 is shown to include only one enclosure 410, in other embodiments data storage system 400 includes a large number of enclosures 410 contained within one or more industry standard racks, with each enclosure 410 having some or all of the features of data storage system 400 of FIGS. 4A-4B.

Figure 4A:
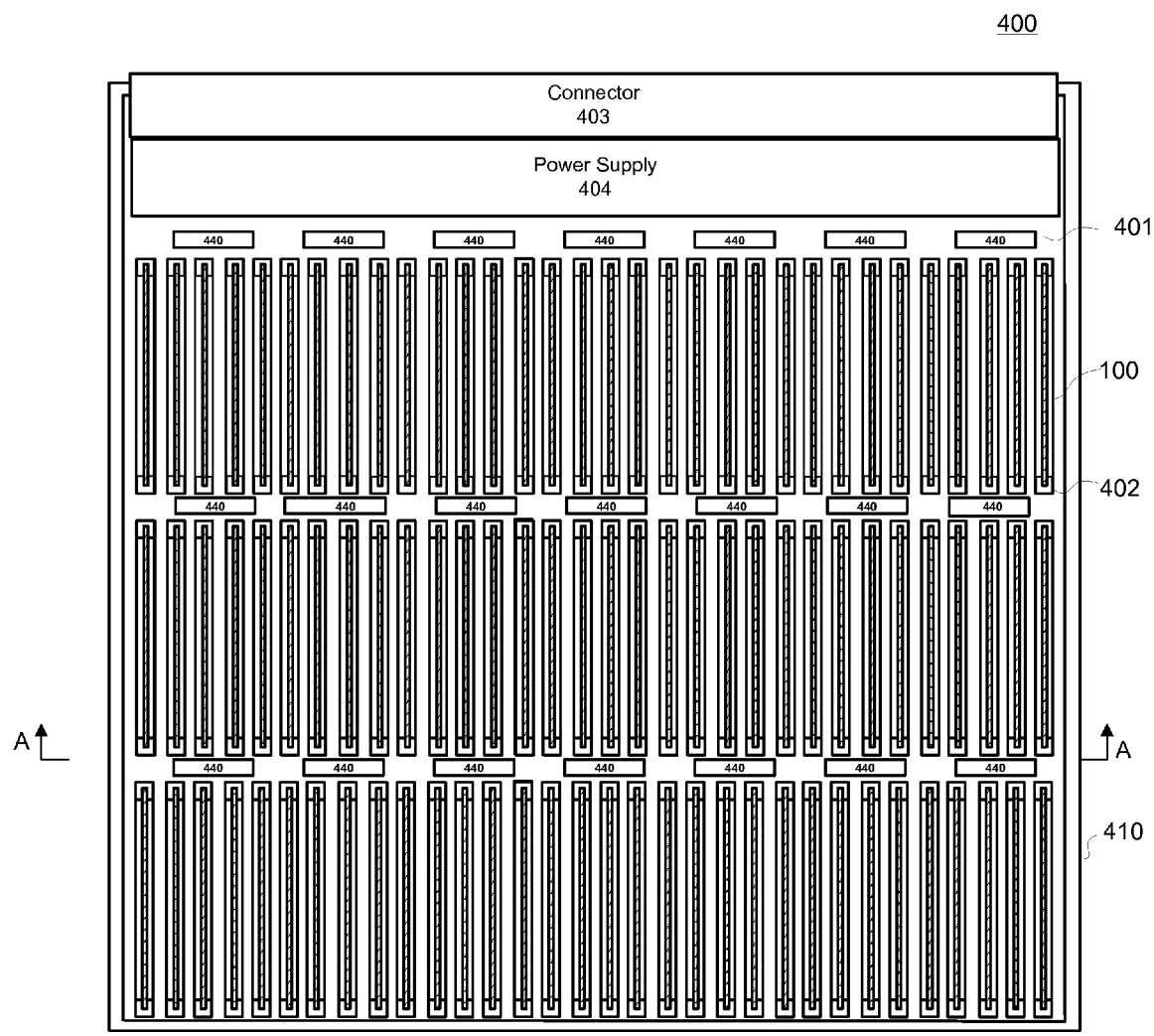
FIG. 4A is a top view of a data storage system that includes the memory modules shown in FIGS. 1-3, where the top of the enclosure is not shown in accordance with an embodiment of the present invention.

Referring now to FIG. 4A it can be seen that enclosure 410 includes a total of 96 memory modules 100. Thereby, data storage system 400 provides a large amount of data storage in a small amount of area (high-density data storage). In the present embodiment each of flash memory devices 141-160 are 64 gigabyte NAND based flash memory devices. Accordingly, each memory module 100 in data storage system 400 provides 1.28 terabytes of flash memory. In this embodiment each of DRAM devices 120-129 includes a 512 megabyte DDR2 SDRAM integrated circuit die. Thereby each memory module 100 in data storage system 400 includes 5.12 gigabytes of DRAM memory. Accordingly, data storage system 400 provides 122 Terabytes of flash memory and 491 gigabytes of SDRAM memory.

The modular design of memory storage system 400 allows for memory modules 100 to be easily changed while using existing industry standard connections. Also, modules 100 are organized in enclosure 410 and on circuit board 101 in such a way as to ensure a clear air flow through the enclosure 410. This allows for effective power dissipation from memory modules 100. Moreover, in one embodiment memory storage system 400 is configured to be dynamically changed such that a user can dynamically pull and insert DIMMs while the power is on to change them out.

It is appreciated that the configuration of memory module 100 can include different sizes of DRAM device, different sizes of flash memory device and more or fewer DRAM devices and/or flash memory devices. In addition, some memory modules 100 in data storage system 400 may include more flash memory or more DRAM memory than other memory modules, with memory modules 100 easily removed and replaced as new DRAM and flash memory devices become available. In one alternate embodiment each of DRAM devices 120-129 is a 1 gigabyte DDR2 SDRAM integrated circuit die, providing 10 gigabytes of DRAM memory on each memory module 100.

This flexibility in the modules inherent design provides strong capabilities for a number of differing applications based upon customer need. In the present embodiment, since integrated circuit device 130 is a field programmable gate array device, the software within integrated circuit device 130 can easily be reprogrammed for differing applications within the same system. Moreover, small regions within integrated circuit device 130 can be reprogrammed while the rest of integrated circuit device 130 remains actively working. These two capabilities permit systems which employ the memory modules 100 to have different modules configured for different purposes, perhaps at different times, in order to achieve a particular function.

Data storage system 400 contains a very large amount of storage (122 Terabytes in our example) in a very small amount of space. If we treated each module as a disk, we would say that we have effectively 96 disk drives in one 2 U 19 inch rack chassis. To accomplish the same number of disk drives using 2.5 inch Hard Disk Drives (HDDs), would require at least 6 U, or three times the volume. However, each memory module 100 can produce a vastly larger number of IOPS than conventional prior art HDDs. In some configurations, an 11× increase in raw IOPS is possible from flash alone. Moreover, by using the DDR memory as a large cache can provide substantially higher IOPS.

Figure 4B:
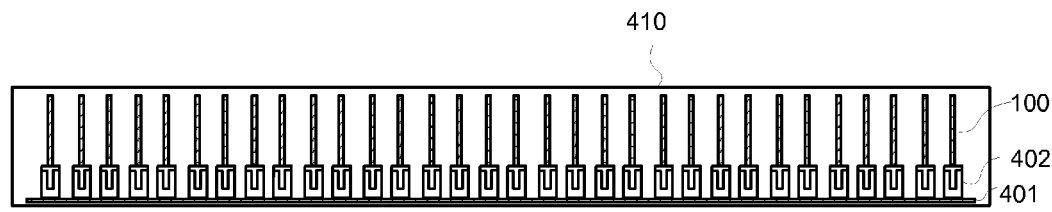
FIG. 4B is a cross-sectional view of the data storage system of FIG. 4A along section A-A in accordance with an embodiment of the present invention.
Figure 5A:
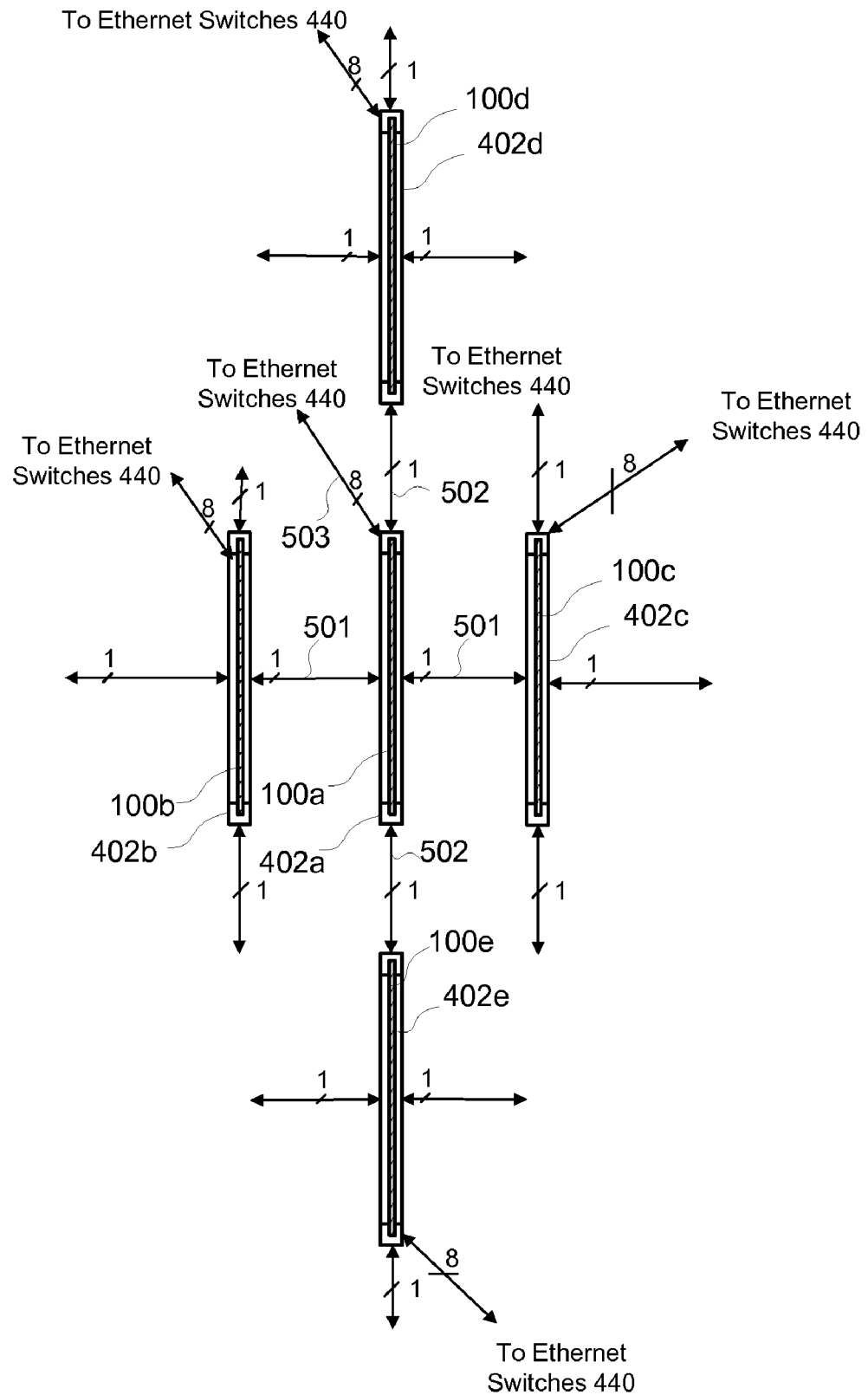
FIG. 5A is a diagram that illustrates an example of the connections between memory modules of the data storage system of FIGS. 4A-4B in accordance with an embodiment of the present invention.

In one embodiment, each receptacle 402 is directly connected to horizontally adjacent receptacles by one channel of gigabit Ethernet and is directly connected to vertically adjacent receptacles by one channel of gigabit Ethernet. The remaining eight channels of gigabit Ethernet are coupled to switch 440. This structure is illustrated in FIG. 5a which shows exemplary connections between a receptacle 402a and adjacent receptacles 402b-402e. In this embodiment one channel of gigabit Ethernet 501 couples to each of the memory modules 100b-100c that are adjacent to memory module 100a horizontally and one channel 502 of gigabit Ethernet couples to each of the memory modules 100d-100e that are adjacent to memory module 100a vertically. More particularly, in the present embodiment socket 402a connects directly via metal traces on circuit board 401 to sockets 402b, 402c, 402d and 402e. In this embodiment eight channels of gigabit Ethernet are coupled to Ethernet switches 440 as shown by line 503. In the present embodiment some or all of the sockets 402 in the embodiment shown in FIG. 4A-4B are coupled in the same manner. This embodiment also permits the eight channels of gigabit Ethernet to be configured as two channels of 10 gigabit Ethernet.

In the present embodiment, the multi gigabit transceivers of each integrated circuit device 130 are operable to control communication over channels 501-502. Accordingly, the channels 501-502 only need to include conductive traces that extend between respective sockets 402a-e and do not need any type of switch or other device on circuit board 401 to implement gigabit Ethernet channels 501-502.

Figure 5B:
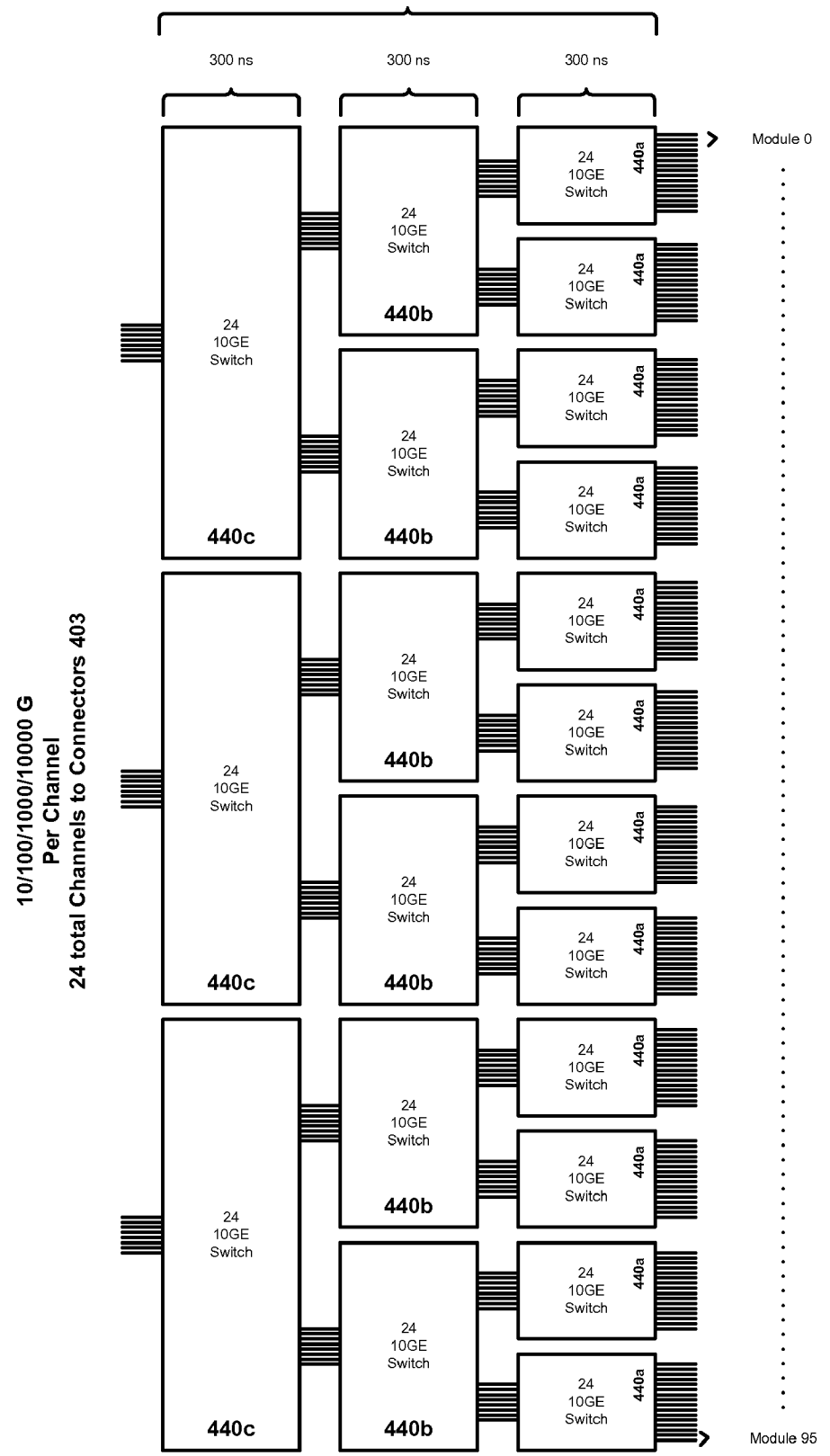
FIG. 5B is a diagram that shows how Ethernet switches of FIGS. 4A-4B may be coupled to provide ten gigabit Ethernet in accordance with an embodiment of the present invention.

FIG. 5B shows an embodiment in which switches 440 include switches 440a, switches 440b and switches 440c that are each 24-port ten gigabit Ethernet switches. In this embodiment each socket 402 includes 8 MGTs 320 organized as two channels of 10 gigabit Ethernet that are electrically coupled to an Ethernet switch 440a. Eight ports of each Ethernet switch 440a are electrically connected to an Ethernet switch 440b, eight ports of each Ethernet switch 440b are electrically connected to an Ethernet switch 440c and eight ports of each Ethernet switch 440c are electrically connected to eight ports of ten gigabit Ethernet on connector 403. In the present embodiment the connections between sockets 402, Ethernet switches 440a, 440b, 440c and connector 403 are electrical traces on circuit board 401. Thereby, the Ethernet switch architecture shown in FIG. 5B provides 24 channels of ten gigabit Ethernet to connector 403 and 192 channels of 10 gigabit Ethernet to sockets 402 of FIG. 4 (two 10 gigabit Ethernet channels per socket 402).

In the example shown in FIGS. 5A-5B, ten gigabit Ethernet is used as a backbone to connect from the outside world via 24 ports of ten gigabit Ethernet to the 192 ports of 10 gigabit Ethernet on the 96 modules. This allows multiple users to concurrently access the data content on the modules, allowing for concurrent independent data storage and searches. It should be understood that FIG. 5B is an exemplary switch architecture and that many different switch architectures are possible in accordance with embodiments of the present invention.

Figure 6:
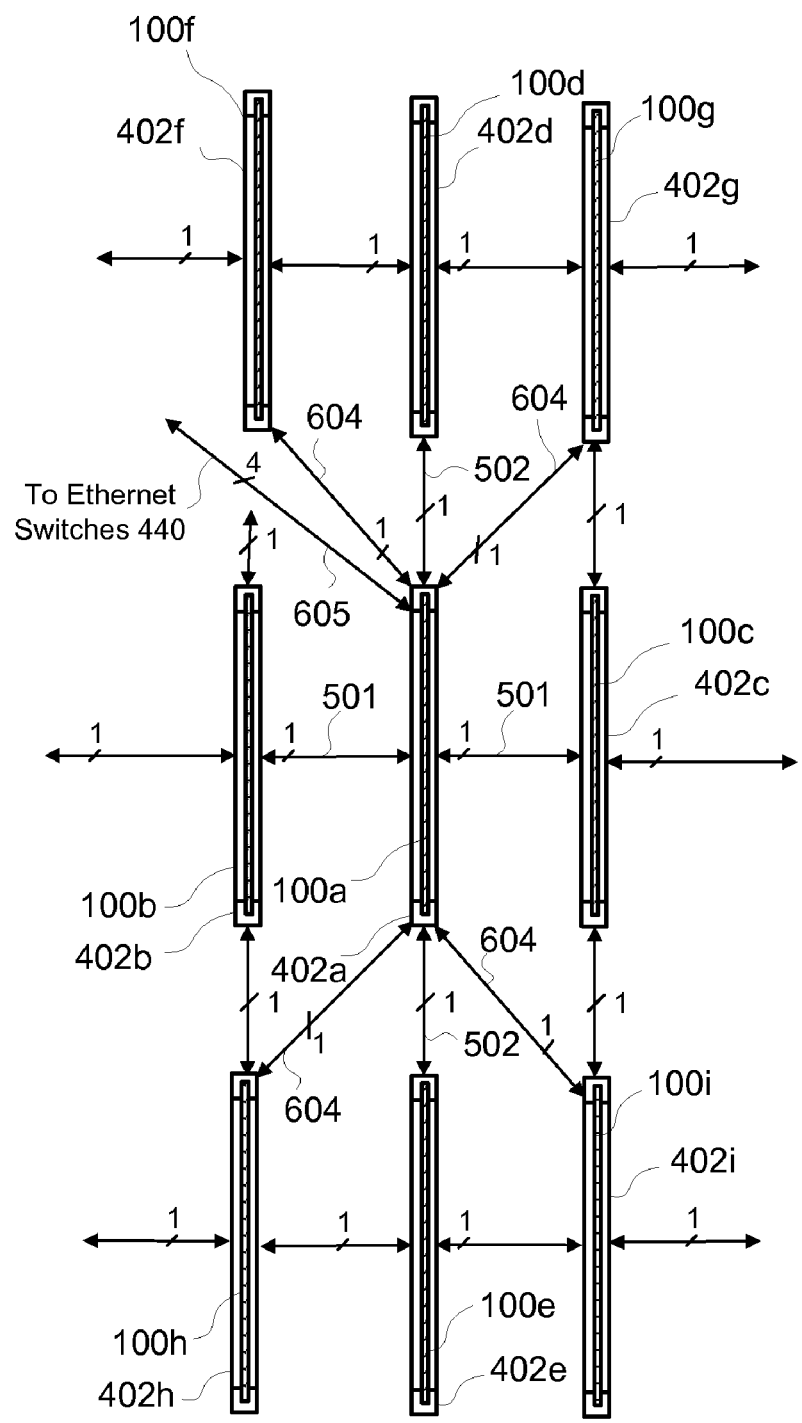
FIG. 6 is a diagram that illustrates connections between memory modules of a data storage system of FIGS. 4A-4B in which sockets that adjoin diagonally are connected together in accordance with an embodiment of the present invention.

FIG. 6 shows an alternate embodiment in which, in addition to coupling to horizontally and vertically adjacent sockets 402 in the manner shown in FIG. 5A, memory module 100a couples diagonally to each memory module 100f-100i that is adjacent to memory module 100a diagonally. More particularly, one channel of gigabit Ethernet 606 connects, via metal traces on circuit board 401, directly to each of sockets 402f-402i. In this embodiment, four channels of gigabit Ethernet 605 are coupled to Ethernet switches 440, or one channel of 10 gigabit Ethernet. In one embodiment some or all of the sockets 402 in the embodiment shown in FIG. 4A-4B are coupled in the same manner as socket 402a of FIG. 6.

Figure 7:
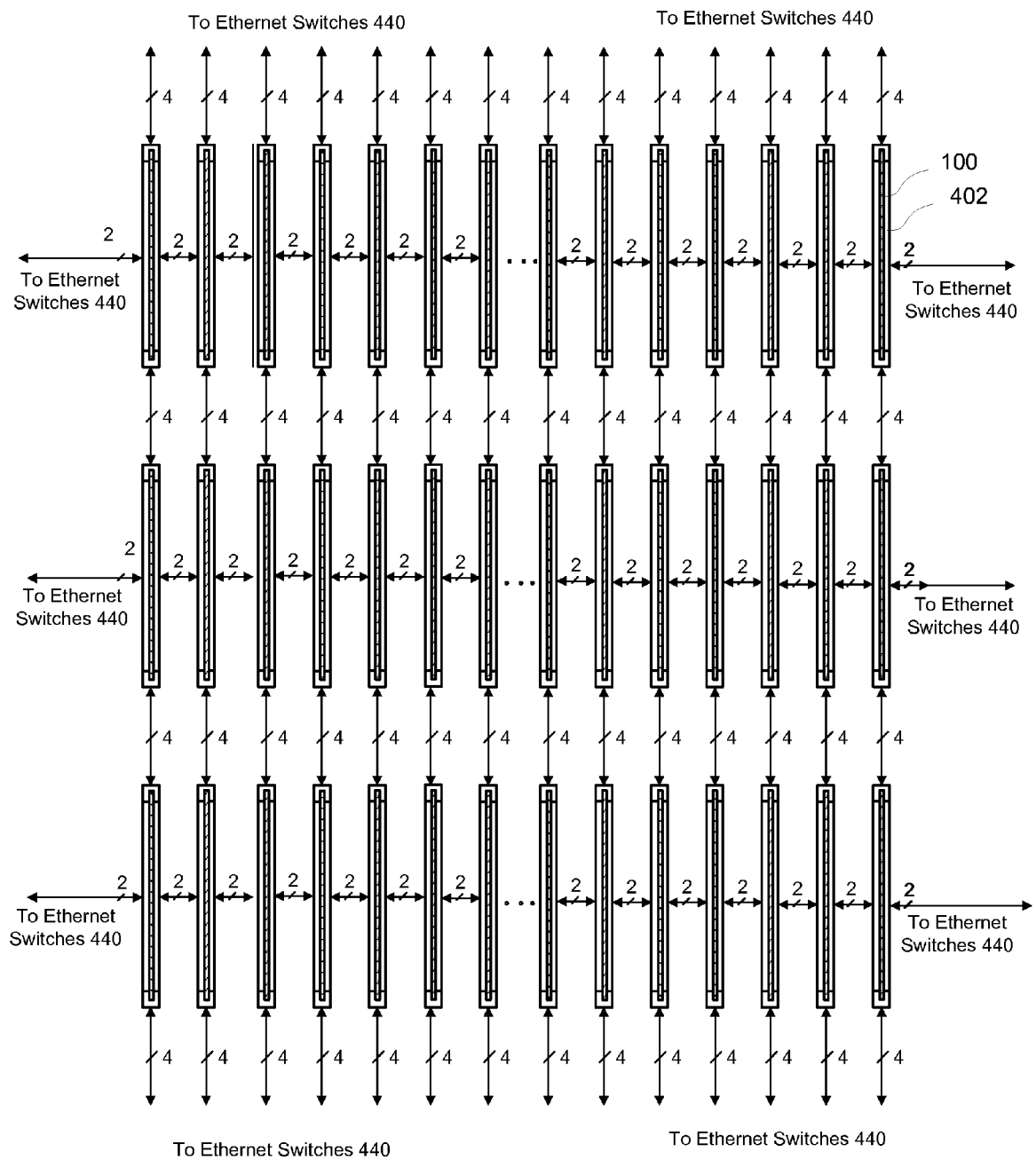
FIG. 7 is a diagram that illustrates connections of a data storage system of FIGS. 4A-4B in which sockets are connected to achieve high vertical connectivity in accordance with an embodiment of the present invention.

In the embodiment shown in FIG. 7, each socket 402 is directly connected to horizontally adjacent receptacles 402 by two channels of gigabit Ethernet and is directly connected to vertically adjacent receptacles 402 by four channels of gigabit Ethernet (or one 10 gigabit Ethernet channel), with sockets 402 on the edges of the pattern coupling to switches 440. More particularly, in one embodiment traces on circuit board 401 couple sockets 402 together to achieve the desired structure. In this embodiment each socket on the top row will couple four channels of gigabit Ethernet to switches 440 and each socket on the bottom row will couple four channels of gigabit Ethernet to switches 440, with receptacles on the outside rows coupling two channels of gigabit Ethernet to switches 440.

Though the embodiments of FIGS. 5A-7 show communication between adjoining memory modules 100 using gigabit Ethernet channels, communication between memory modules can also be provided by using dedicated I/O connections. More particularly, in one embodiment I/O pins 340 of adjoining sockets 402 are connected together in the same manner as shown in FIG. 5A, freeing up all twelve gigabit Ethernet channels to be coupled to connector 403 and/or switches 440. Similarly, by using dedicated I/O connections and the architecture of FIG. 7B, the number of gigabit Ethernet channels coupled to connector 403 can be increased to eight (or two channels of 10 gigabit Ethernet).

The examples shown in FIGS. 5A-7 are exemplary. They illustrate the flexibility provided by the apparatus and methods of the present invention. In embodiments of the present invention each data storage system 400 is designed such that the interconnections between modules 100 and switches 440 are tailored to meet the needs of the particular application.

Moreover, though the structures of FIGS. 4A-7B illustrate the use of switches 440 that are Ethernet switches it is appreciated that other types of switches and connection mechanisms could also be used. It is appreciated that other types of switches and other types of communication protocols can be used for communication between modules and for communication between individual memory modules 100 and external devices. In one embodiment Xilinx's Aurora Protocol is used for communication between individual memory modules 100 and/or between memory modules 100 and external devices. Alternatively, Serial ATA (SATA), Serial Attached SCSI (SAS) or other known communication methodologies and physical devices could be used.

Figure 8A:
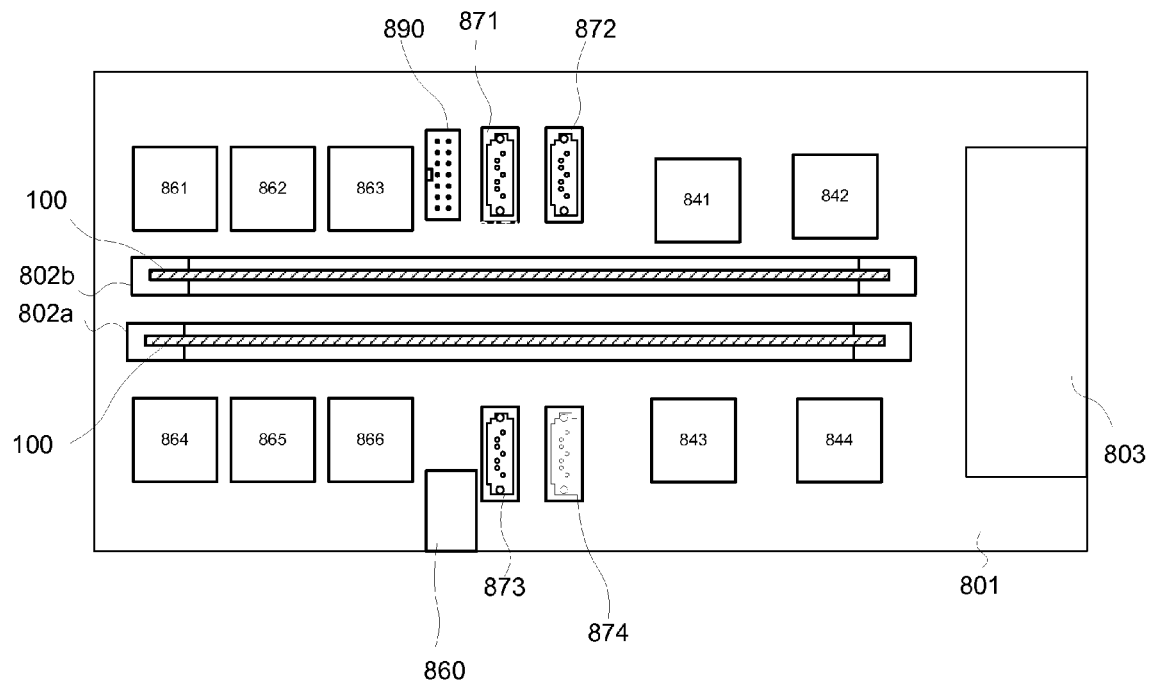
FIG. 8A is a top view of an exemplary data storage system that includes both gigabit Ethernet and SATA connections in accordance with an embodiment of the present invention.
Figure 8B:
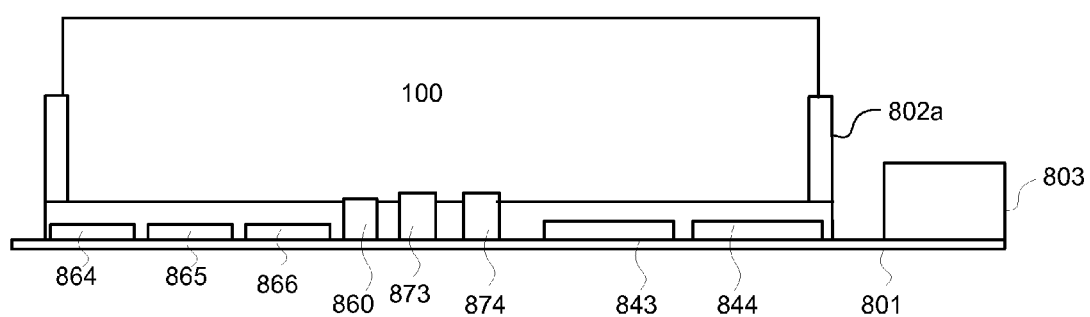
FIG. 8B is a side view of a portion of the data storage system of FIG. 8A in accordance with an embodiment of the present invention.

In one embodiment that is illustrated in FIG. 8A-8B, a data storage system 800 is shown that uses SATA connectors 871-874, gigabit Ethernet Phy 841-844, gigabit Ethernet connector 803 and sockets 802a-802b that are coupled (e.g., soldered) to circuit board 801. Data storage system 800 also includes power supply integrated circuit devices 861-866 that are electrically connected to a power input connector 860 for powering memory modules 100 and the other components of system 800. Circuit board 801 can be a 26.28 cm. by 12.66 cm. printed circuit board. In other embodiments, system 800 can be larger and can employ a larger number of receptacles 802a-b and memory modules 100.

Figure 9:
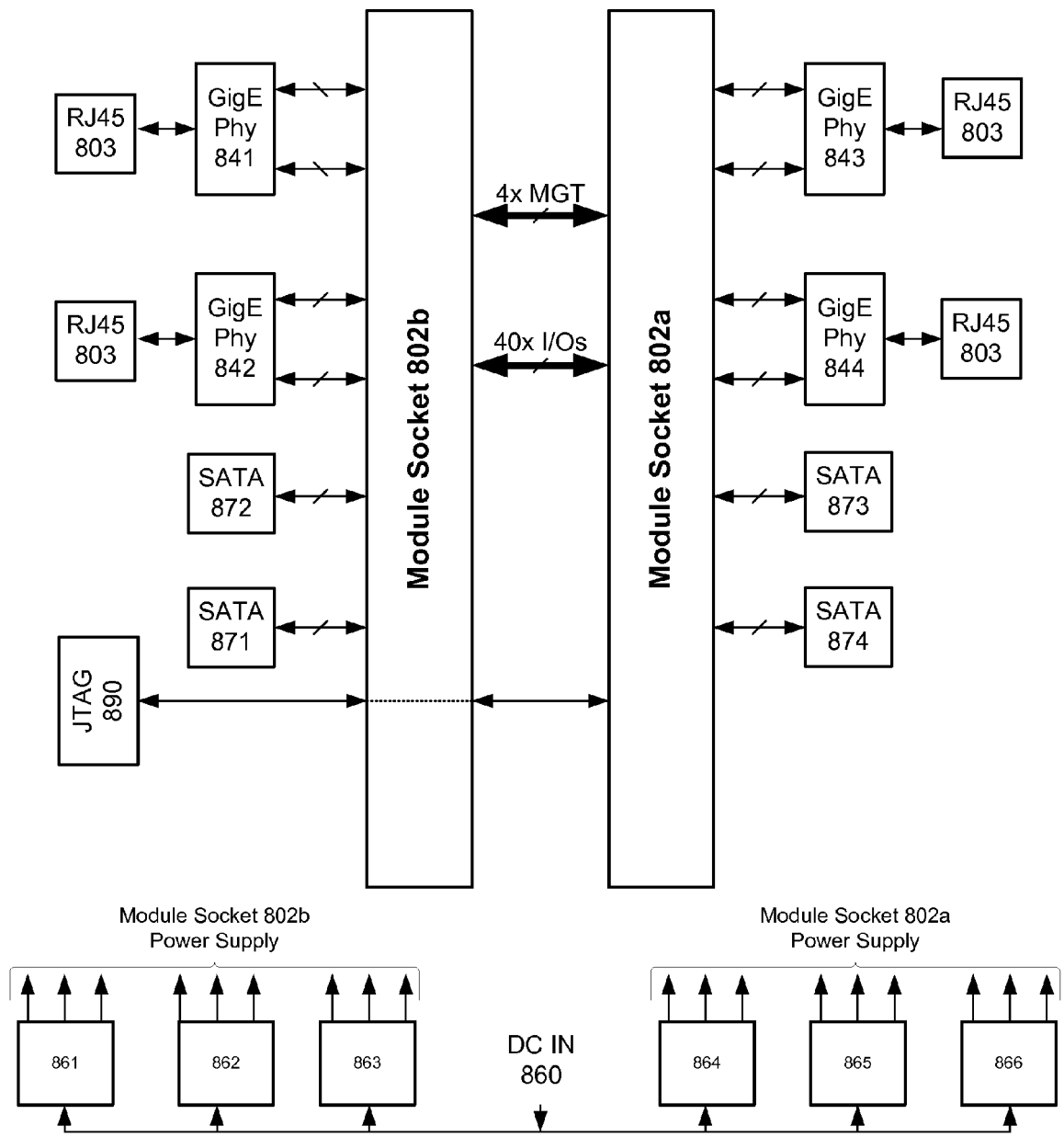
FIG. 9 is a block diagram showing the structure of the data storage system of FIGS. 8A-8B in accordance with an embodiment of the present invention.

FIG. 9 is the block diagram showing components attached to circuit board 801 of data storage system 800 shown in FIGS. 8A-8B. It shows the connections of sockets 802a and 802b to gigabit Ethernet Phy 841-844. In the present embodiment Ethernet Phy 841-844 are 1 gigabit Ethernet physical interface chips that are electrically connected to connector 803 which can be, for example a Gigabit Ethernet RJ-45 Halo Fastjack having four receptacles. More particularly, socket 802a is electrically connected to gigabit Ethernet Phy 843-844 that are electrically connected to connector 803. Similarly, socket 802b is electrically connected to gigabit Ethernet Phy 841-842 that are also electrically connected to connector 803. Communication between socket 802a and 802b is provided by either of four multi-gigabit channels (4×MGTs 320) and/or 40 input/output lines (40×I/Os) that extend between socket 802a and 802b. JTAG port 890 electrically connects to both socket 802a and socket 802b such that it is shared between the memory modules 100 in sockets 802a-802b. SATA connectors 871 and 872 electrically connect to socket 802b and SATA connectors 873-874 electrically connect to socket 802a.

Figure 10:
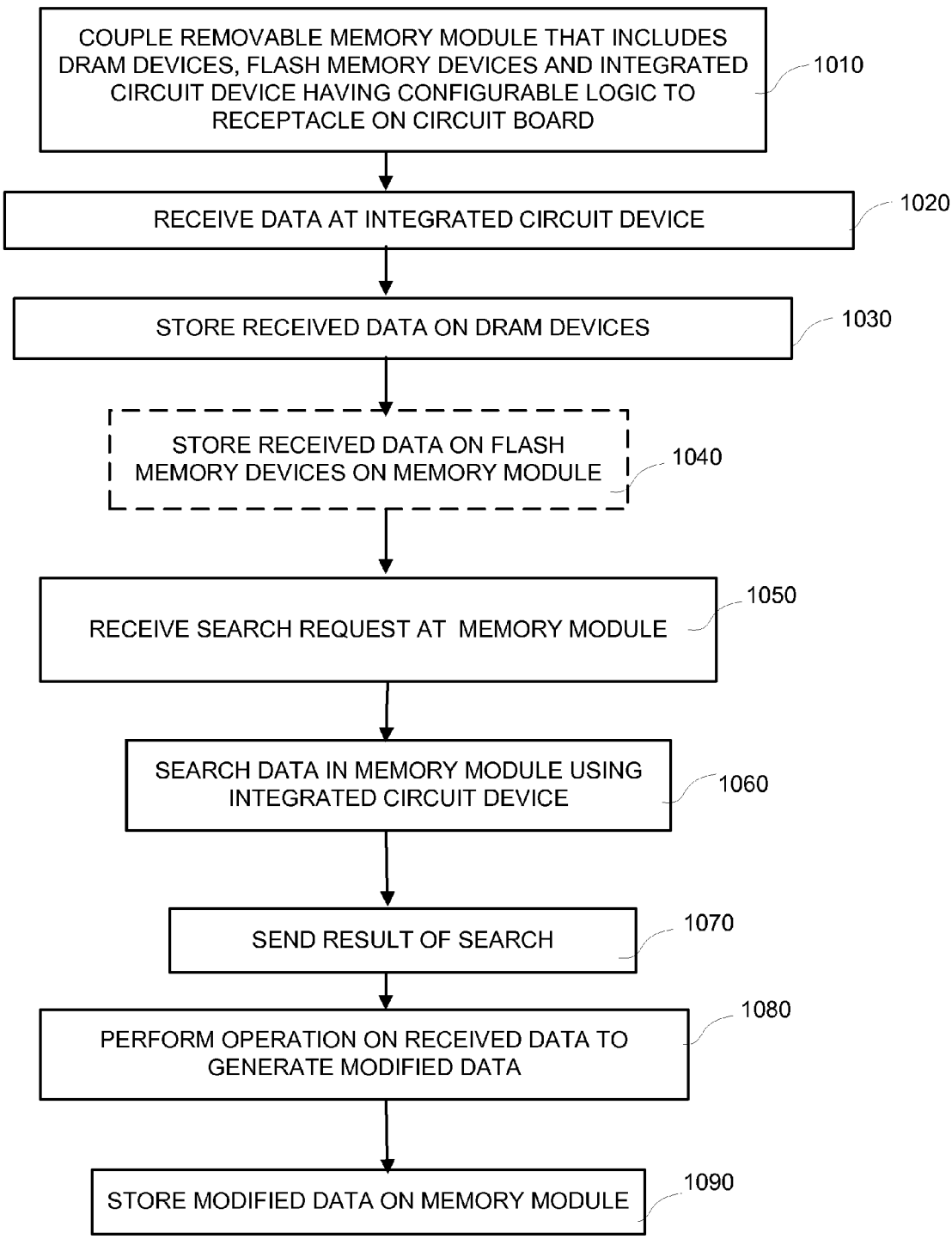
FIG. 10 is a diagram that illustrates a method for storing and retrieving data, and performing operations on the data in accordance with an embodiment of the present invention.

FIG. 10 shows a method 1000 for storing and retrieving data in accordance with aspects of the present invention. As shown by step 1010 a removable memory module is coupled to a socket on a circuit board, where the removable memory module includes DRAM memory, flash memory and an integrated circuit device having configurable logic. In the embodiment shown in FIG. 4A-4B, step 1010 can be performed by inserting a memory module 100 onto a socket 402.

Referring to step 1020 data is received at the integrated circuit device. In the embodiment shown in FIG. 4A-4B data is coupled to integrated circuit device 130 by sending the data to connector 403 which couples the data through Ethernet switches 440 to the socket 402 that holds the memory module 100. The received data is sent from socket 402 through interface 170 to integrated circuit device 130.

The received data is then stored on one or more of the DRAM devices as shown by step 1030. In the embodiment shown in FIGS. 4A-4B the received data is transmitted through one or more of channels 301-305 of DRAM memory to one or more of DRAM devices 120-129.

Optionally, as shown by step 1040 the received data is stored on one or more flash memory devices. In the embodiment shown in FIGS. 4A-4B the received data can be read from DRAM memory devices 120-129 and stored on one or more of flash memory devices 141-160. In one embodiment, when integrated circuit device 130 is not busy performing data storage, data retrieval or data processing it saves the received data in flash memory devices 141-160.

In one embodiment received data is initially stored in DRAM memory devices 120-124 and is moved across channels 311-315 for storage in flash memory devices 141-160 at a later time. More particularly, the data initially stored in DRAM device 120 is stored on flash memory devices 141-144 and received data that is initially stored on DRAM device 121 is stored on flash memory devices 145-148. Similarly, received data that is initially stored on DRAM device 122 is stored on flash memory devices 149-152; received data that is initially stored on DRAM device 123 is stored on flash memory devices 153-156; and received data that is initially stored on DRAM device 124 is stored on flash memory devices 157-160.

In accordance with one aspect of the present invention the number of IOPS of the data storage system is increased by using the DRAM devices initially for storing data since the process of writing data to DRAM devices 120-129 is significantly faster than the process of storing data on flash memory devices 141-160.

Referring now to step 1050 a search request is received at the memory module. In the embodiment shown in FIGS. 4A-4B, when a search request is received at socket 402 the search request is coupled through interface 170 to integrated circuit device 130. In accordance with the present embodiment the search request does not include a sector address. Instead, it includes the data information to be searched for. This is quite different from conventional data storage systems that find data using 512 byte sectors and sector addresses.

In one embodiment, the requesting device issues the search request by broadcasting the search request. More particularly, the search request includes information indicating that the transmission is a search request and further indicates the data information to be searched for. In some embodiments of the present invention the search request also indicates the data sets that are to be searched. For example, the search request can be simultaneously or nearly simultaneously broadcast via one or more of the Ethernet channels that couple to MGT pins 320 to integrated circuit device 130 of each memory module 100 in data storage system 400.

As shown by step 1060 the received data is searched using the integrated circuit device. In the embodiment shown in FIGS. 1A-5B integrated circuit device 130 is operable to search the received data to determine whether the received data includes the data information received in step 1050. In one embodiment integrated circuit device 130 searches the received data. In one specific embodiment where integrated circuit device 130 includes a processor 210, the circuitry of processor 210 can be used to search the received data. When all of the received data is stored in DRAM devices 120-129, the search process includes searching the received data in DRAM devices 120-129. If some of the received data to be searched is not stored in DRAM devices 120-129 and is stored in flash memory devices 141-160, flash memory devices 141-160 are then searched. By first searching DRAM devices 120-129 performance is improved since searches of DRAM devices 120-129 will be faster than searches of flash memory devices 141-160.

When a search request is broadcast to ports of all of memory modules 100 of data storage system 400 to search for a particular piece of data information, all integrated circuit devices 130 on all memory modules 100 can simultaneously search for the data information. This precludes the need for a host computing device to look sequentially through the data contents and substantially reduces the number of required IOPS to obtain the data information. This can significantly reduce the amount of data transferred across the transport layer providing a 10, 100, or even a 1000 fold increase in apparent IOPS of the system.

As shown by step 1070 the results of the search are sent from the integrated circuit device to external circuitry. More particularly, the results are sent to circuitry that is external to the memory module 100 that is performing the search. In the embodiment shown in FIGS. 4A-4B the results of the search are sent from integrated circuit device 130 to interface 170 and through socket 402 to circuitry external to module 100. For example, when the search request is from a device external to memory system 400 (e.g., a host computer coupled to connector 102 via Ethernet), the results are coupled through switches 440 and connector 403 to the requesting device over the Ethernet link.

Because of the extensive processing capability of each integrated circuit device 130 of the present invention each memory module can be considered "smart." Accordingly independent memory modules 100 can all simultaneously perform data mining operations. Moreover, independent memory modules 100 can be assigned different parts of a data storage or data mining operation. In addition, individual memory modules can perform operations on the stored data independently of the device that initially transmitted the data into the data storage system 400. Thereby, modified data can be stored in either DRAM devices 120-129 and/flash memory devices 141-160. Moreover data can be moved from flash memory to DRAM devices 120-129 when the data is required for searches and/or data operations and can be then moved to flash memory devices 141-160 when the space in DRAM devices 120-129 is needed for storing new data or for some other application. The use of DRAM devices 120-129 as a large cache, and in particular the use of DRAM devices 120-129 for initially saving received data allow each memory module 100 to produce a vastly larger number of IOPS than conventional prior art data storage methods. In some configurations, an 11× increase in raw IOPS is possible as compared to prior art systems. Moreover, the number of IOPS available to the system is increased by reducing the number of required transfers to the module since the search operation is conducted independently by the integrated circuit device 130 of each memory module 100.

In embodiments of the present invention individual memory modules perform operations on the received data as shown by step 1080 to generate modified data. In the embodiment shown in FIGS. 4A-4B, an integrated circuit device 130 on an individual memory module 100 can independently perform one or more operations on data received in step 1020 at that memory module 100. The modified data is then stored as shown by step 1080. In the present embodiment the modified data is stored in either DRAM devices 120-129 and/or flash memory devices 141-160. Depending on the application, the modified data can be stored so as to replace the data received in step 1020 or can be stored in addition to the data received in step 1020. In one embodiment the operations of step 1080 are performed in accordance with programs or instructions loaded into integrated circuit device 130 upon configuration of integrated circuit device 130. In other embodiments the operations of step 1080 are performed in response to receiving instructions or programming at an integrated circuit device 130 that were sent from a device external to memory system 400.

The operations performed in step 1080 can be any of a number of different types of operation, including but not limited to mathematical operations (e.g., add, subtract, multiply, divide, etc.) and logical operations (e.g., AND, OR, XOR, NOT, shift, compare, etc.) and can include programmed sequences of mathematical and logical operations that include store and fetch operations in which data is temporarily stored in one or more DRAM device 120-129.

Steps 1080-1090 can be performed at any time after the data is received in step 1020 and can be performed prior to the receiving a search request in step 1050 such that, if the modified data generated in step 1080 is the data information indicated in the search request of step 1050, the result of the search in step 1070 will include the modified data.

Although steps 1080-1090 are described as being performed entirely within an individual memory module 100 (by performing operations using the integrated circuit device 130 on the memory module 100 on data stored on that particular memory module 100) it is appreciated that, alternatively, operations can be performed in an integrated manner between integrated circuit devices 130 on different memory modules. For example, one integrated circuit device 130 can request that one or more operation be performed by a different integrated circuit device 130, allowing tasks to be shared between the processing features of different memory modules 100.

In one embodiment memory system 400 includes some memory modules 100 having extensive processing capabilities (e.g., having an integrated circuit device 130 that includes one or more processors 210 or extensive programmed processing logic) and other memory modules 100 with less extensive processing capabilities (e.g., having a less expensive integrated circuit device 130 with no processor 210 and/or less extensive programmed processing logic), resulting in a memory system 400 that is lower cost than a memory system 400 in which all integrated circuit devices 130 include extensive processing capabilities. In this embodiment, the operations of step 1080 can be performed by a memory module 100 having extensive processing capabilities on data in a different memory module 100. For example, a first memory module 100 with the extensive processing capabilities can send a request directly to an integrated circuit device 130 on a second memory module 100 that includes the data to be processed. The integrated circuit device 130 on the second memory module 100 sends the data to the first memory module 100 which then performs the operations and sends the modified data back to the second memory module 100 for storage on the second memory module 100. Thereby tasks can be shared between the processing features of different memory modules 100.

The methods and apparatus of the present invention are particularly applicable to applications where very large amounts of data must be stored and processed such as the PanSTARRS program run by the University of Hawaii. In one embodiment in which data storage system 400 is used in the PanSTARRS program, the data from each of the four 1.4 gigapixel cameras (one in each 2-meter telescope) is stored in data storage system 400. This can be, for example, a few hundred images of the sky every night looking for near earth objects—those which might conceivably hit the earth. In one embodiment a portion of each 3 gigabyte image (image data) is stored on each memory module 100. After the image data is stored, each integrated circuit device 130 is operable to perform certain operations (step 1080) on the image data stored in its memory module 100. In one embodiment each integrated circuit device 130 will perform mathematical operations, reduce the data, and digitally look for the objects which have moved frame to frame (e.g., using a compare operation). From this data an ephemeris is calculated which predicts the path of the found objects. In the present embodiment calculation of the ephemeris is performed by the integrated circuit device 130 of the memory module 100 that stores the image data that includes the found object (e.g., using mathematical operations in a step 1080).

Similarly, the methods and apparatus of the present invention can be used in the Large Hadron Collider (LHC) program. In this embodiment the image data from the LHC's detector array (approximately 300 Gb/sec of data) and 27 terra bytes of raw data per day is stored on memory modules 100 and each integrated circuit device 130 is operable to perform certain operations on the image data stored in its memory module 100. In one embodiment each integrated circuit device 130 will perform mathematical operations to identify particle types and trajectories and to generate a reduced data set that is then stored in memory module 100.

Though the methods and apparatus of the present invention have been discussed in the context of the PanSTAARs and LHC programs, it is appreciated that the methods and apparatus of the present invention can be used in any of a number of different applications that process terra-scale data sets (exacomputing) as well as in traditional enterprise class storage applications.

In one embodiment the methods and apparatus of the present invention are incorporated into a conventional massive array of PCs tied together to form a network by coupling a massive array of data storage systems 400 to the PC's in the array. This provides an immense amount of computational horsepower that could be used for exacomputing applications.

The methods and apparatus of the present invention allow for some of memory modules 100 of data storage system 400 to be dynamically programmed to be different things. For example, perhaps only some of memory modules 100 are used as data storage while other modules are used to perform computational elements. Additionally, the computational elements can be temporally shared such that at different times each memory module 100 does a different computation on the prior data. Since the data can be stored in flash memory, it is resident in between full and/or partial reconfigurations of the integrated circuit device 130. Accordingly, the data storage system of the present invention has the ability to dynamically shift from a storage system to a computational system. Some of the advantages that this presents is the ability for a particular memory module 100 to issue a search request to a different memory module 100. Thereby, searches can be propagated through data storage system 400 in any way that meets the needs of the particular application.

In the embodiment shown in FIG. 2 each integrated circuit device 130 includes a processor 210. In one embodiment a disk operating system is stored in one or more of the memory modules 100 and is run on processor 210. This provides the ability to run a disk operating system directly on one or more memory module 100. Thereby, the host processor can be relieved of a relatively difficult task and the result is parallel execution across multiple memory modules 100 using the broadcast mechanism previously discussed. That slightly increases the load to each memory module 100, but only the module with the file in question needs do anything further (e.g., send the result of the search in step 1070). Moreover, when the search request does not require action by a particular memory module (e.g., the request only involves data saved on other memory modules 100) a particular memory module 100 can simply ignore the search request, allowing it to continue performing other tasks. Also, the memory module 100 that contains the data to be searched now has the ability to manage the storage of the data in a means which is best for the implementation. For example, if the modules are battery backed up, then it is possible to retain the "file" forever in DRAM memory (e.g. cache) in case it may be later needed. It would only be written to flash when the cache must be flushed or the power fails. This has huge advantages to the notions of wear leveling which are required for flash based mass storage device. The module approach of the present invention eliminates the need for the host to speak anything other than "File based I/O". This in turn further substantially reduces the number of apparent IOPS for any particular file based transaction.

Another aspect of the method and apparatus of the present invention is that each generation of flash requires differing implementations of wear leveling, bad "sector" mapping, and even native "sector" size. This means that the host would have to bear the burden of special (and potentially different) knowledge for each kind of "drive" that it can see. In the present embodiment, each integrated circuit device 130 is operable to manage flash devices 140-160, relieving the host operating system of this responsibility. In addition, each integrated circuit device 130 can be easily reprogrammed, either by uploading new programming or by reconfiguring the configuration data of a particular memory module 100. Thereby, the method and apparatus of the present invention allow for easily changing wear leveling algorithms, ECC algorithms and spare sectoring methodology. Accordingly, the method and apparatus of the present invention that can adapt to changing requirements of the flash memory. Moreover, since memory modules 100 are easily replaced, the method and apparatus of the present invention allow for easily implementing new flash memory technologies. In addition, by providing independent processing capabilities on each memory module 100, the method and apparatus of the present invention allow for the effective use of flash memory while overcoming the limitations of conventional data storage systems that include massive arrays of PCs tied together to form a network.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A memory module comprising:
a circuit board;
an integrated circuit device having configurable blocks, the integrated circuit device coupled to the circuit board;
a plurality of Dynamic Random Access Memory (DRAM) devices coupled to the circuit board and electrically coupled to the integrated circuit device so as to form a plurality of parallel channels of DRAM memory;
a plurality of flash memory devices coupled to the circuit board and coupled to the integrated circuit device so as to form a plurality of parallel channels of flash memory; and
an interface coupled to the circuit board and electrically coupled to the integrated circuit device for coupling input and output between the integrated circuit device and external circuitry,
wherein the integrated circuit device is configured to receive data and to store the received data on one or more of the plurality of DRAM devices and the plurality of flash memory devices, and further wherein the integrated circuit device is configured to receive a search request that indicates data information, and to search the received data for the data information, wherein the search request does not indicate a sector address.

2. The memory module of claim 1 wherein the interface is a card-edge connector that is configured to be coupled to a socket of a device such that the memory module can be inserted into the socket for adding memory to the device and such that the memory module can be removed from the socket for removing memory from the device.

3. The memory module of claim 1 wherein the integrated circuit device comprises a field programmable gate array device.

4. The memory module of claim 1 wherein the circuit board conforms to the JEDEC DDR2 dual in-line memory module interface mechanical standard and the interface comprises a card-edge connector that conforms to the JEDEC DDR2 dual in-line memory module interface mechanical standard, wherein the card edge connector does not conform to electrical requirements of the JEDEC DDR2 dual in-line memory module interface mechanical standard.

5. The memory module of claim 1 wherein the plurality of flash memory devices include a configuration flash memory device that stores configuration data for configuring the integrated circuit device, the configuration data including a bit stream for programming the integrated circuit device and including software programming code that can be installed on the integrated circuit device.

6. The memory module of claim 1 wherein the integrated circuit device includes a plurality of multi-gigabit transceivers.

7. The memory module of claim 6 wherein the integrated circuit device includes a hard-core Central Processing Unit (CPU).

8. The memory module of claim 1 wherein the integrated circuit device is configured to receive data and to store the received data on one or more of the plurality of DRAM devices and the plurality of flash memory devices, and further wherein the integrated circuit device is configured to perform an operation on the received data responsive to an instruction to perform the operation and subsequent to storage of the received data to generate modified data, and to store the modified data on one or more of the plurality of DRAM devices and the plurality of flash memory devices.

9. The memory module of claim 8 wherein the integrated circuit device is configured to generate the modified data responsive to receiving an instruction to modify the data from circuitry external to the memory module.

10. The memory module of claim 8 wherein the search request originates from circuitry external to the memory module.

11. A data storage system comprising:
a first circuit board;
a plurality of sockets coupled to the first circuit board;
a connector coupled to each of the sockets for coupling each of the sockets to external circuitry; and
a plurality of memory modules, each memory module disposed within one of the sockets, each memory module comprising:
a second circuit board;
an integrated circuit device having configurable blocks, the integrated circuit device coupled to the second circuit board;
a plurality of Dynamic Random Access Memory (DRAM) devices coupled to the second circuit board and electrically coupled to the integrated circuit device so as to form a plurality of parallel channels of DRAM memory;
a plurality of flash memory devices coupled to the second circuit board and coupled to the integrated circuit device so as to form a plurality of parallel channels of flash memory; and
an interface electrically coupled to the second circuit board and to the integrated circuit device,
wherein each memory module is directly communicatively linked via the first circuit board to at least two other memory modules and is configured to communicate with one another using Ethernet.

12. The data storage system of claim 11 wherein the interface is a card-edge connector and each of the sockets are configured to couple to the card-edge connector.

13. The data storage system of claim 11 wherein the integrated circuit device comprises a field programmable gate array device and wherein the plurality of flash memory devices include a configuration flash memory device that stores configuration data for configuring the field programmable gate array device.

14. The data storage system of claim 11 wherein the integrated circuit device is configured to receive data and to store the received data on one or more of the plurality of DRAM devices and the plurality of flash memory devices, and further wherein the integrated circuit device is configured to receive a search request that indicates data information to search for and to search within the received data for the data information, wherein the search request does not comprise a sector address.

15. The data storage system of claim 11 wherein the integrated circuit device is configured to receive data and to store the received data on one or more of the plurality of DRAM devices and the plurality of flash memory devices, and further wherein the integrated circuit device is configured to perform an operation on the received data responsive to an instruction to perform the operation and subsequent to storage of the received data to generate modified data, and to store the modified data on one or more of the plurality of DRAM devices and the plurality of flash memory devices.

16. A method comprising:
coupling a removable memory module that includes a plurality of DRAM devices, a plurality of flash memory devices and an integrated circuit device having configurable blocks to a socket on a circuit board;
receiving data at the integrated circuit device;
storing the received data on one or more of the DRAM devices;
receiving a search request at the memory module, wherein the search request does not comprise a sector address;
searching the received data using the integrated circuit device; and
sending the results of the search from the integrated circuit device to external circuitry.

17. The method of claim 16 further comprising:
after the storing the received data on one or more of the DRAM devices, storing the received data on one or more of the flash memory devices.

18. The method of claim 16 wherein the search request includes data information and wherein the searching the received data further comprises searching the received data to determine whether the received data includes the data information.

19. The method of claim 16 further comprising:
performing an operation on the received data responsive to an instruction to perform the operation and subsequent to storage of the received data to generate modified data; and
storing the modified data in one or more of the DRAM devices and the plurality of flash memory devices.

20. The method of claim 19 wherein the integrated circuit device performs the operation on the received data.

* * * * *